United States Patent
Ru

(10) Patent No.: US 7,839,214 B2
(45) Date of Patent: Nov. 23, 2010

(54) SIGNAL NONLINEAR DISTORATION MAGNITUDE DETECTION METHOD AND DEVICE

(75) Inventor: Hongtao Ru, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 155 days.

(21) Appl. No.: 11/721,709

(22) PCT Filed: Dec. 21, 2004

(86) PCT No.: PCT/CN2004/001484

§ 371 (c)(1),
(2), (4) Date: Aug. 4, 2009

(87) PCT Pub. No.: WO2006/066448

PCT Pub. Date: Jun. 29, 2006

(65) Prior Publication Data

US 2010/0007415 A1 Jan. 14, 2010

(51) Int. Cl.
*H03F 1/26* (2006.01)
(52) U.S. Cl. .................................... 330/149
(58) Field of Classification Search ............ 330/149; 455/63.1, 114.2, 114.3
See application file for complete search history.

(56) References Cited

U.S. PATENT DOCUMENTS

| | | | |
|---|---|---|---|
| 6,246,286 B1 * | 6/2001 | Persson | 330/149 |
| 6,993,301 B1 * | 1/2006 | Kenington et al. | 455/114.3 |
| 7,098,734 B2 * | 8/2006 | Hongo et al. | 330/149 |

FOREIGN PATENT DOCUMENTS

| CN | 1390063 A | 1/2003 |
|---|---|---|
| WO | 0120775 A1 | 3/2001 |

* cited by examiner

*Primary Examiner*—Khanh V Nguyen
(74) *Attorney, Agent, or Firm*—Christopher L. Parmelee; Walker & Jocke

(57) ABSTRACT

The present invention relates to a method for detecting signal nonlinear distortion magnitude, used for extracting and detecting the nonlinear distortion output by a radio frequency power amplifier, characterized in respectively extracting input signal and output signal, and performing square after matching the amplitudes and frequencies of the input signal and output signal respectively, obtaining respective low frequency components of the squared input signal and output signal, therefore, the carrier component of the signals can be filtered, and the low frequency components can characterize the distorted signal feature as well as facilitate handling. The present invention performs square after matching the input signal and output signal, extracts the low frequency component, and then the relativity with the frequency and bandwidth of the signal is low, therefore, the difficulty in detecting the distortion can be reduced greatly. In addition, the square is equivalent to amplify the distortion, which is favorable to improve the detection sensitivity of output distortion.

11 Claims, 3 Drawing Sheets

SIGNAL NONLINEAR DISTORATION MAGNITUDE DETECTION METHOD AND DEVICE

TECHNICAL FIELD

The present invention relates to a method and a device for detecting signal nonlinear distortion magnitude, and especially, to a method and a device for detecting the output nonlinear distortion magnitude of a radio frequency power amplifier linearizafion system.

BACKGROUND ART

With the development of radio communication technology, people greatly improve the reverse receiving sensitivity of the base station through frequency expanding technology, diversity technology, smart antenna technology, and etc., and at the same time, higher power is needed to transmit the signals of the base station so as to balance the forward/reverse power of the system and reduce the cost of the system. In addition, frequency spectrum resource is increasingly becoming a rare resource, in order to improve the utilization efficiency of the frequency spectrum so as to carry more information in the unit bandwidth, the amplitude and phase of the signal are designed to carry information, and this renders sharp change of the amplitude of the signal, which is represented by the non-constant envelope characteristic and the peak-to-average power ratio of the signal. In order to interact more information, the bandwidth of the signal is becoming wider and wider. In practical application, the increase in the number of users renders the demand for the multi-carrier system more and more urgent, and in order to avoid the interference between the carriers and the interference of the present system to other systems, it is required that the radio frequency amplifier has high adjacent channel suppression ratio and low spurious emission, and hence, the linearization technology of the power amplifier becomes a key technology in modern radio communication system.

The linearization system of the power amplifier can be divided into two parts: one is a compensation system of the nonlinear distortion, and the other part is a self-adaptive adjusting system of the nonlinear distortion compensation parameter. The latter adjusts the compensation parameter of the power amplifier nonlinear distortion self-adaptively according to the distortion magnitude, thereby realizing that the linearization system of the power amplifier has better linear index in each application circumstance. The detection of the distortion magnitude is the basis of the self-adaptive adjustment of the compensation parameter, and the detection accuracy thereof directly determines the improvement of the performance of the whole linearization system, and therefore, the detection of the distortion magnitude is an important technology in the linearization technology of the power amplifier.

In the current method for extracting the distortion magnitude, it is necessary to demodulate the output signal, analyze and process the demodulated baseband signal, filter the useful signals through shifting frequencies and using better rectangle coefficient of the intermediate frequency filter, so as to obtain distortion. The prior art depends on the frequency and bandwidth of the input signal, and the original distortion is not obvious, which is unfavorable for the distortion detection.

SUMMARY OF THE INVENTION

The present invention aims to provide a method and a device for detecting signal nonlinear distortion magnitude, so as to solve the following technical problems in the current method for extracting the distortion magnitude: it is necessary to demodulate the output signal, the representation of the distortion depends on the frequency and bandwidth of the input signal, the carrier needs to be processed, and the distorted signal is too small to favor detection.

In order to realize the above objects, the present invention provides a method for detecting signal nonlinear distortion magnitude, used for extracting and detecting the nonlinear distortion output by a radio frequency power amplifier, characterized in respectively extracting input signal and output signal, and performing square after matching the amplitudes and frequencies of the input signal and output signal respectively, obtaining respective low frequency components of the squared input signal and output signal, so as to filter the carrier components of the signals, and the low frequency components can characterize the distorted signal feature as well as facilitate handling.

The above method for detecting signal nonlinear distortion magnitude, characterized in further comprising the following steps: step 1, matching the carrier frequency with the work frequency of a multiplier through a frequency matching unit; step 2, matching the input signal and output signal for time delay; step 3, performing square on the input signal and output signal respectively; and step 4, filtering the two signals obtained from square, and filtering the high frequency components of the two signals, and then obtaining two low frequency components.

The above method for detecting signal nonlinear distortion magnitude, characterized in further comprising: step 5, performing subtraction on the two low frequency components, thereby reducing the non-distorted components.

The above method for detecting signal nonlinear distortion magnitude, characterized in further comprising: step 6, performing high pass filtration on the subtracted signals, thereby further reducing the non-distorted components.

The above method for detecting signal nonlinear distortion magnitude, characterized in further comprising: step 7, performing integral on the high pass filtered signals, thereby extracting the distortion detecting signal which can characterize the output distortion magnitude.

In order to realize the object of the present invention much better, the present invention further provides a device for detecting signal nonlinear distortion magnitude, characterized in comprising: an input branch, which is composed of an input signal coupling unit, an input time delay matching unit, an input coupling signal amplitude adjusting unit, an input square unit and an input low pass filtering unit that are connected successively; an output branch, which is composed of an output signal coupling unit, an output time delay matching unit, an output coupling signal amplitude adjusting unit, an output square unit and an output low pass filtering unit that are connected successively; the input low pass filtering unit and the output low pass filtering unit are connected with an input/output subtracting unit, and an integral unit is connected to the input/output subtracting unit; respectively extracting the input signal and output signal through the input branch and the output branch, performing square after matching the amplitudes and frequencies of the input signal and output signal, obtaining the respective low frequency components of the squared input signal and output signal, therefore, so as to filter the carrier components of the signals, and the low frequency components can characterize the distorted signal feature as well as facilitate handling.

The above device characterized in that, the input coupling signal amplitude adjusting unit is connected to the input square unit through an input frequency matching unit, the output coupling signal amplitude adjusting unit is connected to the output square unit through an output frequency matching unit, and the integral unit is connected to the input/output subtracting unit through a high pass filtering unit.

The above device characterized in that, the input frequency matching unit comprises an input mixing unit and an input low pass filtering unit, the output frequency matching unit comprises an output mixing unit and an output low pass filtering unit, and the input mixing unit is connected to the output mixing unit through a local oscillation signal generating unit.

The above device characterized in that, the input signal coupling unit is further connected to the output signal coupling unit through a power amplifying unit.

Compared with the prior art, the present invention has the following advantages:

The first advantage of the present invention is that, it obtains the distorted signal using the square of the signal. If the signal comprises a distorted component, a low frequency component will be generated after the square, so as to make the process convenient. In addition, there are many types of multiplier of square, and the technology thereof is mature and easy in realization. Therefore, complex process such as I, Q demodulations are omitted.

The second advantage of the present invention is that, the distorted signal is obtained through squaring and obtaining the low frequency component, so that the carrier component can be filtered, in other words, this distortion detecting method is irrelevant to the carrier, thereby reducing the stages for processing the carrier.

The third advantage of the present invention is that, it is convenient for miniaturization and realization using ASIC. The technologies and elements employed, no matter the multiplier or the integral circuit, are both suitable for the ASIC realization, and further, it can be seen from the detector of ADI. A very small element can perform multiplication, filtration and integral. In addition, the present invention can be applied to a very wide frequency range.

The fourth advantage of the present invention is that, it subtracts the non-distorted signal through a subtracter, thereby improving the resolution of the distorted signal. After the square and filtration, the non-distorted signal is still the main part and is greatly more than the distorted component, which brings much difficulty in detecting the distorted component, while the input signal and output signal are relevant, therefore, through the subtraction between them, the non-distorted magnitude can be conveniently reduced a lot, thus improving the resolution of the distorted component.

The fifth advantage of the present invention is that, it realizes the detection of the distorted signal magnitude through integral and omits the workload of frequency spectrum analysis.

The sixth advantage of the present invention is that, part of the processes such as a filtering portion, a subtraction circuit or even an integral portion circuit, are conducted in a low cost simulation method. This greatly reduces the difficulty in digital process, and the reliability of the system is improved because of passive realization.

The seventh advantage of the present invention is that, the time delay in realization is short, and the timeliness is better. The detection serves for the self-adaptation, and the timeliness is an important index of the self-adaptation. For the time being, for some technologies, technologies such as intermediate frequency surface acoustic are used to filter the non-distorted signal, although better effect can be achieved, the time delay of the detection will be increased a lot.

The distortion detecting system according to the present invention can effectively detect the distortion component magnitude and reduce the difficulty and data magnitude in processing the distortion component, besides, the system is suitable for miniaturization and realization using ASIC.

BRIEF DESCRIPTION OF THE ACCOMPANYING DRAWINGS

EMBODIMENTS FOR CARRYING OUT THE PRESENT INVENTION

The present invention will be further described in details hereinafter in conjunction with the accompanying drawings.

Figure 1:
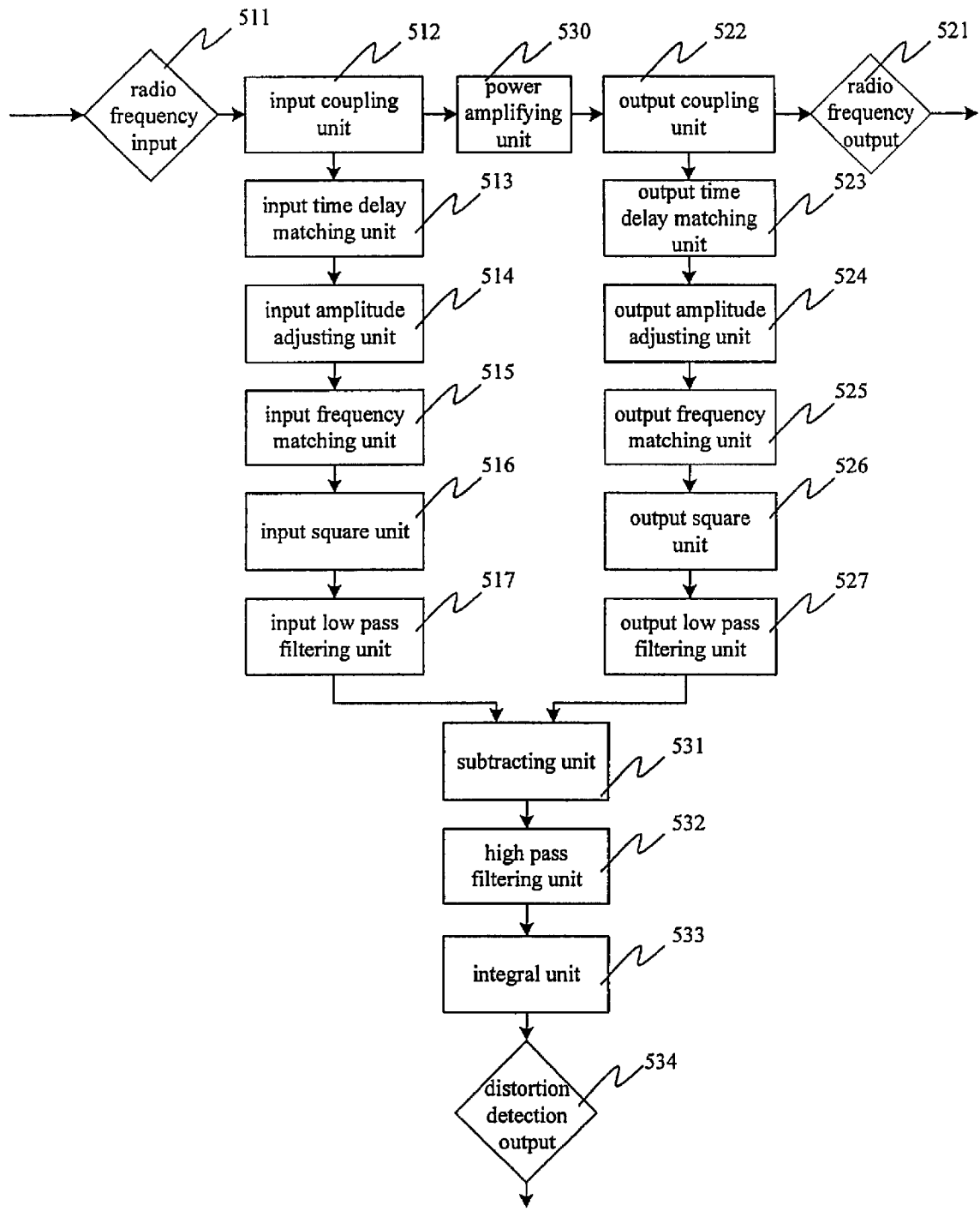
FIG. 1 is a flow chart of the present invention.

FIG. 1 is a flow chart illustrating the method of the present invention in conjunction with the device. The present invention will be described in details in conjunction with the flow chart. Signals are coupled from a radio frequency input terminal 511 and a radio frequency output terminal 521 through an input coupling unit 512 and an output coupling unit 522, and the input coupling unit 512 is connected with the output coupling unit 522 through a power amplifying unit 530, their input and output time delays are respectively matched by an input time delay matching unit 513 and an output time delay matching unit 523, this mainly aligns the input coupling signal and the output coupling signal in time delay. The amplitudes of the two signals are made to be equivalent by an input amplitude adjusting unit 514 and an output amplitude adjusting unit 524 respectively. The frequencies are matched to the ones which can be processed by an input square unit 516 and an output square unit 526 through an input frequency matching unit 515 and an output frequency matching unit 525. Squares for the input signal and output signal are completed in the input square unit 516 and the output square unit 526. Low pass filtration is conducted through an input low pass filtering unit 517 and an output low pass filtering unit 527, and then the low frequency component after the square will be extracted, thereafter, the input standard signals are subtracted through a subtracter 531, then the distorted signals will be obtained. Signals in the standard signal band are further filtered through a high pass filtering unit 532, smooth processing on the distorted signals is conducted through an integral unit 533, and the distortion detection is output by a distortion detection outputting unit 534.

Figure 2:
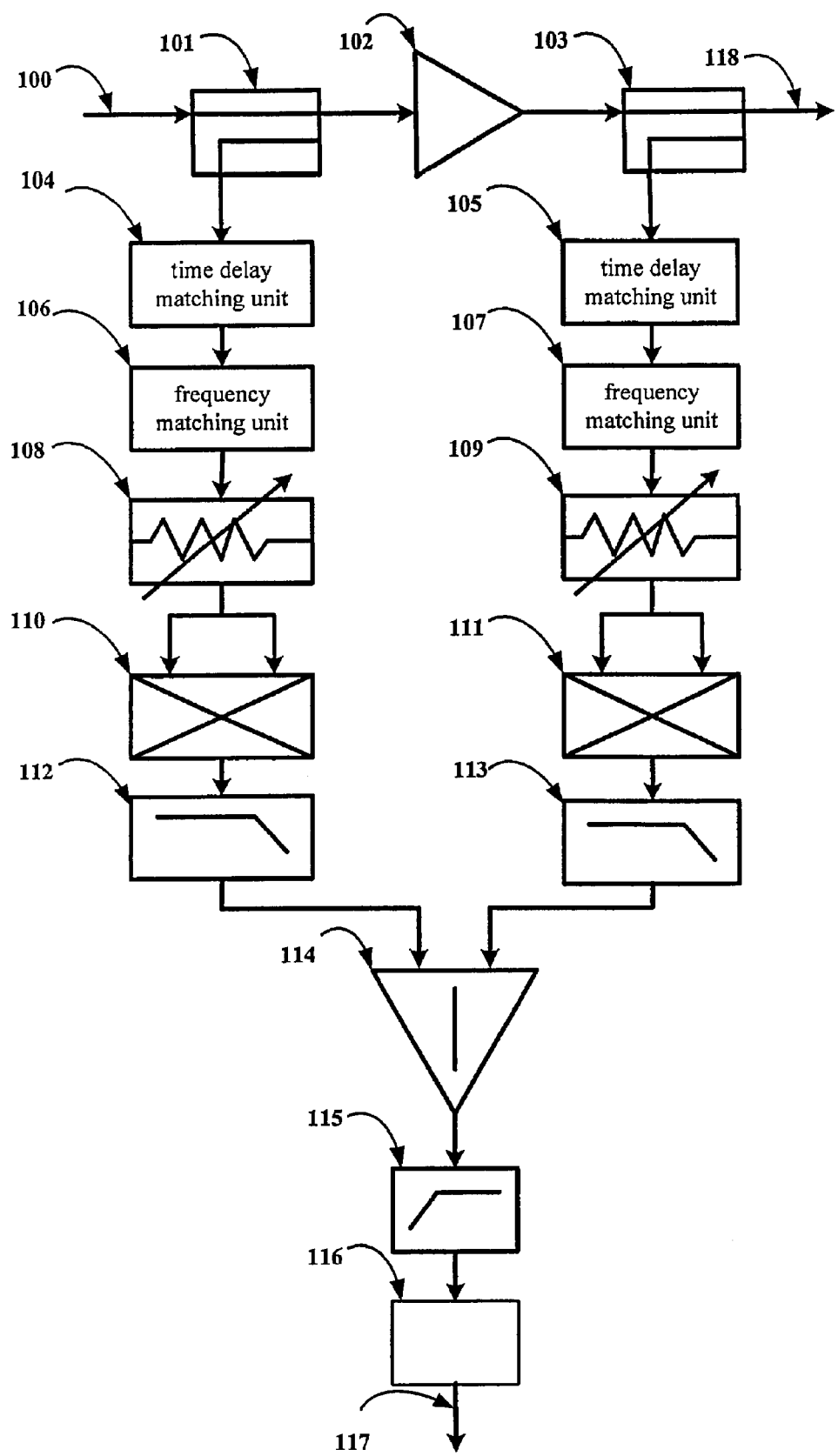
FIG. 2 is a block diagram illustrating the composition of the system according to the present invention.

FIG. 2 is a block diagram illustrating the principle of the present invention, and the following detailed description is made in conjunction with FIG. 2.

The radio frequency input signal 100 couples part of the input signals through an input signal coupling unit 101, and the signals are non-distorted standard or nearly standard signals. Other signals enter a radio frequency power amplifier 102, and the signals output by the radio frequency power amplifier 102 couple part of the output signals of a radio frequency power amplifier through an output coupling unit 103, and the signals include distortion information. The other part of the signals is output as the output signal 118.

The time delay of the input signal extracted by the input signal coupling unit 101 is adjusted by an input time delay matching unit 104, and the time delay of the output signal extracted by the output signal coupling unit 103 is adjusted by an output time delay matching unit 105, through adjusting the time delay, the time delay of the coupled input signal is finally made to be approximately equal to that of the coupled output signal.

The time delay-matched input signal enters an input frequency matching unit 106 for frequency match, and the frequency match aims to convert the frequency of the input signal into a frequency that can be processed by an input square unit 110.

The time delay-matched output signal enters an output frequency matching unit 107 for frequency match, and the frequency match aims to convert the frequency of the output signal into a frequency that can be processed by an output square unit 111.

The input frequency-matched signal enters an input coupling signal amplitude adjusting unit 106 for amplitude adjustment, and the amplitude adjustment aims to render the amplitude of the signal entering an input square unit 108 to be the same as that of the signal entering an output square unit 109.

The output frequency-matched signal enters an output coupling signal amplitude adjusting unit 107 for amplitude adjustment, and the amplitude adjustment aims to render the amplitude of the signal entering an input square unit 108 to be the same as that of the signal entering an output square unit 109.

An input square unit 108 completes the square for the input amplitude-adjusted input signal, and the square aims to make the input signal generate a low frequency signal which can fully characterize the input signal, and meanwhile, other signals may also be generated.

An output square unit 109 completes the square for the output amplitude-adjusted output signal, and the square aims to make the output signal generate a low frequency signal which can fully characterize the output signal, and meanwhile, other signals may also be generated.

An input low pass filtering unit 112 filters other frequency components of the squared input signal, and only keeping the low frequency component to characterize the input signal.

An output low pass filtering unit 113 filters other frequency components of the squared output signal, only keeping the low frequency component to characterize the output signal.

An input/output subtracting unit 114 completes the subtraction for the low pass-filtered input low frequency signal and output low frequency signal, and the subtracted signal is the distortion detecting signal comprising distortion information.

Generally speaking, the distortion detecting signal so obtained may have leakage of the input signal, and the component which may comprise the input signal can be further filtered by a high pass filtering unit 115. Finally, an integral unit 116 performs appropriate integral on the distortion detecting signal, thereby decreasing the difficulty in processing the data.

Figure 3:
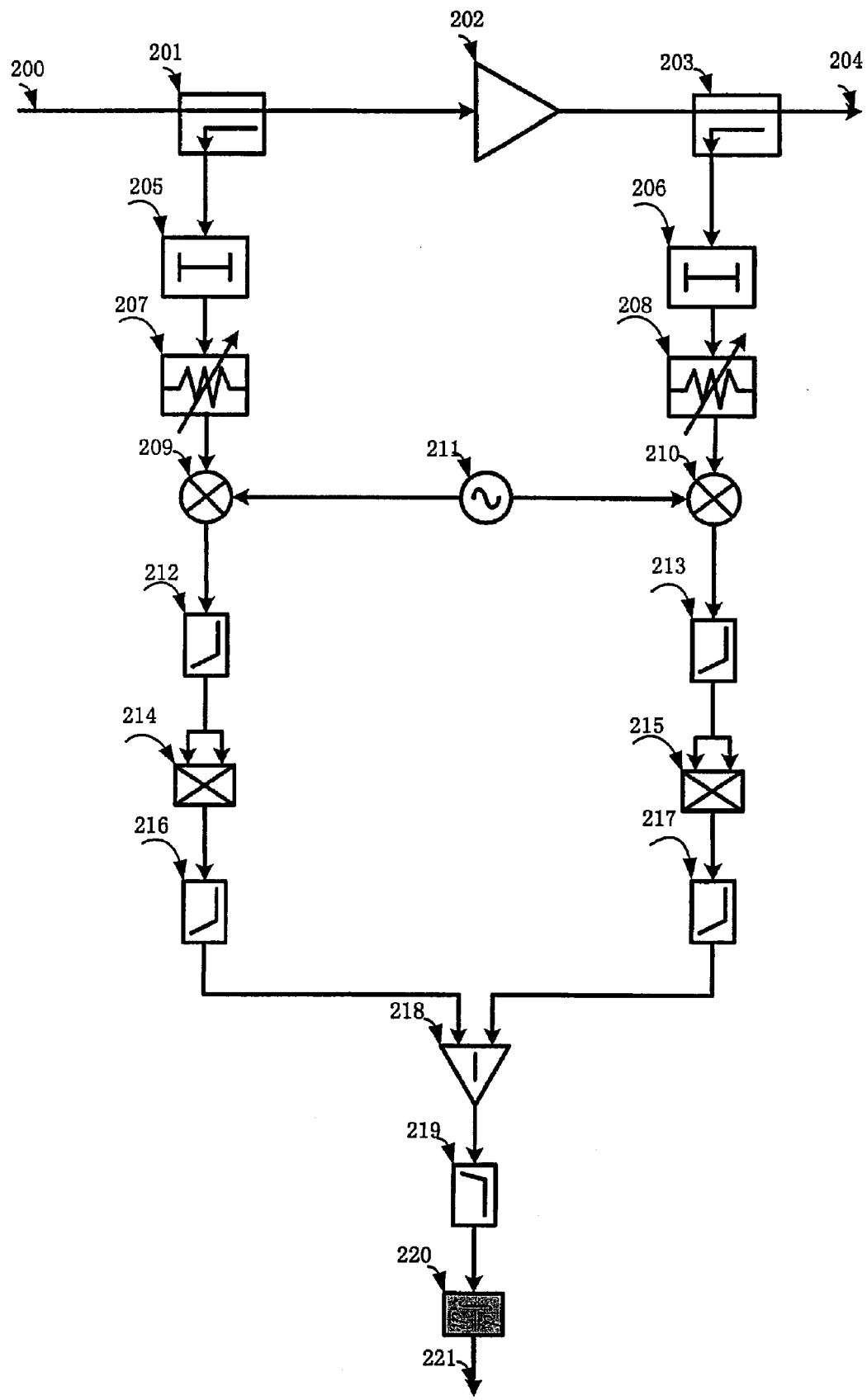
FIG. 3 is a block diagram illustrating the realization of distortion detection.

FIG. 3 is a block diagram illustrating the principle of a system for realizing the distortion detection, and the working procedure thereof will be described below together with the block diagram.

The system comprises: an input signal coupling unit 201, an output signal coupling unit 203, an input time delay matching unit 205, an output time delay matching unit 206, an input coupling signal amplitude adjusting unit 207, an output coupling signal amplitude adjusting unit 208, an input mixing unit 209, an output mixing unit 210, an local oscillation signal generating unit 211, an input low pass filtering unit 212, an output low pass filtering unit 213, an input square unit 214, an output square unit 215, an input low pass filtering unit 216, an output low pass filtering unit 217, an input/output subtracting unit 218, a high pass filtering unit 219, and an integral unit 220.

The radio frequency input signal 200 couples part of input signals through the input signal coupling unit 201, and the signals are non-distorted standard or nearly standard signals. Other signals enter a radio frequency power amplifier 202, and part of the signals output by the radio frequency power amplifier 202 are coupled by the output coupling unit 203, and the signals include the distortion information. The other part of the signals is output as the output signal 204.

The time delay of the input signal extracted by the input signal coupling unit 201 is adjusted by an input time delay line 205, and the time delay of the output signal extracted by the output signal coupling unit 203 is adjusted by the output time delay matching unit 206, the time delay line can be realized using a radio frequency cable of a certain length. Through adjusting the time delay, the time delay of the coupled input signal is finally made to be approximately equal to that of the coupled output signal.

The input coupling signal amplitude adjusting unit 207 adjusts the amplitude of the time delay-matched input signal, and the output coupling signal amplitude adjusting unit 208 adjusts the amplitude of the time delay-matched output signal, finally making the amplitudes of the two outputs equivalent.

The local oscillation generating unit 211 outputs a local oscillation signal to drive the input mixing unit 209 and the output mixing unit 210. For the amplitude-adjusted input signal and output signal, the frequencies of the input signal and output signal are changed to values that are suitable for the square units to process by the input mixing unit 209 and the output mixing unit 210.

The frequency-changed signals are filtered by the input low pass filtering unit 212 and the output low pass filtering unit 213, then extracting the desired signal.

The frequency-changed and filtered signal respectively enters the input square unit 214 and the output signal square unit 215 to complete the square of the signal. The square aims to make the signal generate a low frequency signal which can fully characterize the signal, and meanwhile, other signals may also be generated.

The input low pass filtering unit 216 filters other frequency components of the squared input signal, only keeping the low frequency component to characterize the input signal. The output low pass filtering unit 217 filters other frequency components of the squared output signal, and only keeping the low frequency component to characterize the output signal.

The input/output subtracting unit 218 completes the subtraction for the low pass-filtered input low frequency signal and output low frequency signal, and the subtracted signal is the distortion detecting signal comprising distortion information.

Generally speaking, the distortion detecting signal so obtained may have leakage of the input signal, and the component which may comprise the input signal can be further filtered by the high pass filtering unit 219. Finally, the integral unit 220 performs appropriate integral on the distortion detecting signal, thereby obtaining the signal 221 and decreasing the difficulty in processing the data.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

INDUSTRIAL APPLICABILITY

The present invention solves the following technical problems: it is necessary to demodulate the signal for the extraction and detection of the current nonlinear distortion, the characterization of the distortion relies on the frequency and bandwidth of the input signal, it is necessary to process the carrier, and the distorted signal is too small to favor detection. Through performing square after matching the input signal and output signal, and then extracting the low frequency component, the present invention has little relevancy to the frequency and bandwidth of the signal, thereby greatly decreasing the difficulty in detecting the distortion. In addition, the square is equivalent to amplify the distortion, which is favorable to improve the sensitivity of the output distortion detection. The present invention can be used to detect the nonlinear distortion magnitude output by a radio frequency power amplifier linear system, and can also be used in any relevant filed having such a similar technical problem.

What is claimed is:

1. A method for detecting signal nonlinear distortion magnitude, used for extracting and detecting nonlinear distortion output by a radio frequency power amplifier, characterized in respectively extracting input signal and output signal, and performing square after matching the amplitudes and frequencies of the input signal and output signal respectively, obtaining respective low frequency components of the squared input signal and output signal, so as to filter carrier components of the input and output signals, and the low frequency components can characterize distorted signal feature.

2. The method for detecting signal nonlinear distortion magnitude according to claim 1, characterized in further comprising the following steps:
   step 1, matching carrier frequency with work frequency of a multiplier through a frequency matching unit;
   step 2, matching the input signal and output signal for time delay;
   step 3, performing square on the input signal and output signal respectively; and
   step 4, filtering the input and output signals obtained from square, and filtering high frequency components of the input and output signals, and then obtaining low frequency components.

3. The method for detecting signal nonlinear distortion magnitude according to claim 2, characterized in further comprising: step 5, performing subtraction on the low frequency components, thereby reducing non-distorted components.

4. The method for detecting signal nonlinear distortion magnitude according to claim 3, characterized in further comprising: step 6, performing high pass filtration on the subtracted signals, thereby further reducing the non-distorted components.

5. The method for detecting signal nonlinear distortion magnitude according to claim 4, characterized in further comprising: step 7, performing integral for signals having been performed with high pass filtration, thereby extracting a distortion detecting signal which can characterize output distortion magnitude.

6. A device for detecting signal nonlinear distortion magnitude, characterized in comprising:
   an input branch, which is composed of an input signal coupling unit, an input time delay matching unit, an input coupling signal amplitude adjusting unit, an input square unit and an input low pass filtering unit that are connected successively;
   an output branch, which is composed of an output signal coupling unit, an output time delay matching unit, an output coupling signal amplitude adjusting unit, an output square unit and an output low pass filtering unit that are connected successively;
   the input low pass filtering unit and the output low pass filtering unit are connected with an input/output subtracting unit, and an integral unit is connected to the input/output subtracting unit; and
   respectively extracting the input signal and output signal through the input branch and the output branch, performing square after matching the amplitudes and frequencies of the input signal and output signal, obtaining respective low frequency components of the squared input signal and output signal, so as to filter carrier components of the input and output signals, and the low frequency components can characterize distorted signal feature.

7. The device according to claim 6, characterized in that the input signal coupling unit is further connected to the output signal coupling unit through a power amplifying unit.

8. The device according to claim 6, characterized in that the input coupling signal amplitude adjusting unit is connected to the input square unit through an input frequency matching unit, the output coupling signal amplitude adjusting unit is connected to the output square unit through an output frequency matching unit, and the integral unit is connected to the input/output subtracting unit through a high pass filtering unit.

9. The device according to claim 8, characterized in that the input signal coupling unit is further connected to the output signal coupling unit through a power amplifying unit.

10. The device according to claim 8, characterized in that the input frequency matching unit comprises an input mixing unit and an input low pass filtering unit, the output frequency matching unit comprises an output mixing unit and an output low pass filtering unit, and the input mixing unit is connected to the output mixing unit through a local oscillation signal generating unit.

11. The device according to claims 10, characterized in that the input signal coupling unit is further connected to the output signal coupling unit through a power amplifying unit.

* * * * *